(12) United States Patent
Ito

(10) Patent No.: US 6,646,471 B2
(45) Date of Patent: Nov. 11, 2003

(54) SIGNAL TRANSFER CIRCUIT

(75) Inventor: Minoru Ito, Shiga (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 1 day.

(21) Appl. No.: 10/075,392

(22) Filed: Feb. 15, 2002

(65) Prior Publication Data
US 2002/0167338 A1 Nov. 14, 2002

(30) Foreign Application Priority Data

May 8, 2001 (JP) ........................................ 2001-137486

(51) Int. Cl.[7] ............................................. H03K 19/094
(52) U.S. Cl. ............................. 326/86; 326/82; 326/83; 326/93
(58) Field of Search ............................. 326/30, 82, 83, 326/86, 90, 93

(56) References Cited

U.S. PATENT DOCUMENTS

| 5,369,315 A | * | 11/1994 | Tran ............................. 326/82 |
| 5,578,944 A | | 11/1996 | Sasaki |
| 6,236,256 B1 | | 5/2001 | Brownlow et al. |
| 6,456,111 B1 | * | 9/2002 | Yamaguchi ..................... 326/86 |

FOREIGN PATENT DOCUMENTS

JP          11-242463          9/1999

* cited by examiner

*Primary Examiner*—Anh Tran
(74) *Attorney, Agent, or Firm*—McDermott, Will & Emery

(57) ABSTRACT

A transmission side circuit and a reception side circuit are connected to each other via a signal transfer path. An output transistor of the transmission side circuit has an open drain type structure, and the reception side circuit is provided with a reception transistor that is connected to the signal transfer path. There are provided a precharge transistor for supplying a voltage to a node extending from the reception transistor to an internal circuit, and a selector circuit connected to the gate of the reception transistor. The selector circuit receives a bias voltage Vbi and a ground voltage Vss, and switches the voltage to be applied to the gate of the reception transistor between the bias voltage Vbi and the ground voltage Vss according to the mode switching signal Smd. It is possible to suppress the voltage amplitude of a signal along the signal transfer path, and thus to reduce the electromagnetic interference occurring along the signal transfer path.

9 Claims, 7 Drawing Sheets

SIGNAL TRANSFER CIRCUIT

BACKGROUND OF THE INVENTION

The present invention relates to a signal transfer circuit provided between one transmission side circuit for transmitting a digital signal and one or more reception side circuit for receiving the digital signal.

In the prior art, a digital signal is transferred between ICs typically by using a voltage signal at a low level (e.g., a GND voltage) and a voltage signal at a high level (e.g., a Vdd voltage).

FIG. 8 is an electric circuit diagram illustrating a configuration of a conventional signal transfer circuit using CMIS devices. As illustrated in the figure, the transmission side IC includes an output circuit 110 (inverter) between a terminal for supplying a power supply voltage (Vdd) and the ground. The output circuit 110 includes a first p-channel transistor 102 and a first n-channel transistor 101 connected in series with each other. The reception side IC includes an input circuit 111 (inverter) between a terminal for supplying a power supply voltage (Vdd) and the ground. The input circuit 111 includes a second p-channel transistor 104 and a second n-channel transistor 103 connected in series with each other. An external terminal 105 of the transmission side IC and an external terminal 106 of the reception side IC are connected to each other via a signal transfer path 107. Thus, a digital signal can be transferred between the transmission side IC and the reception side IC.

In the transmission side IC, as a digital signal Sdg is input from an internal circuit to the gate of each of the transistors 101 and 102 of the output circuit 110, a low-level signal is output from the output circuit 110 if the digital signal Sdg is at the high level and a high-level signal is output from the output circuit 110 if the digital signal Sdg is at the low level. Then, as the digital signal is input to the input circuit 111 of the reception side IC via the external terminals 105 and 106, the digital signal is output to an internal circuit of the reception side IC while being inverted again by the input circuit 111.

In recent years, however, the signal transfer speed has been increasing and the number of signals transferred has also been increasing. Accordingly, the electromagnetic interference (EMI) has become problematic in the conventional circuit as described above.

When the level of the signal output from the output circuit 110 is switched from the low level to the high level, or vice versa, a large current flows along the signal transfer path 107 according to the potential transition.

The current occurring due to such potential changes increases as the change in voltage along the signal transfer path 107 is greater. Therefore, the amount of fluctuation of the current value increases as the operating speed of the transistors provided in the output circuit or the input circuit increases. As a result, electromagnetic waves occur along the signal transfer path 107, and the electromagnetic interference caused by the electromagnetic waves may adversely affect the peripheral devices.

SUMMARY OF THE INVENTION

An object of the present invention is to provide a signal transfer circuit with little electromagnetic interference along a signal transfer path by employing means for suppressing the change in voltage along the signal transfer path.

A signal transfer circuit of the present invention is a signal transfer circuit for connecting one transmission side circuit and one or more reception side circuit via a signal transfer path including one signal transfer line per signal, the signal transfer circuit including: an output transistor, provided between one voltage supply section in the transmission side circuit and the signal transfer path, for operating according to a digital signal from an internal circuit of the transmission side circuit; a node, located in the reception side circuit and connected to an internal circuit of the reception side circuit, for outputting a digital signal to the internal circuit of the reception side circuit; a reception transistor located in the reception side circuit between the node and the signal transfer path; and precharge means for precharging the node so as to cause a potential difference between the voltage supply section of the transmission side circuit and the node.

In this way, the output transistor of the transmission side circuit is either allowing a current to flow from the signal transfer path to one voltage supply section or in an open state. When the current flows, the potential of the signal transfer path is substantially equal to the voltage of the one voltage supply section. When in the open state, the potential of the signal transfer path is determined by the voltage supplied from the reception transistor of the reception side circuit. Therefore, by producing, in the reception side circuit, a digital signal to be supplied to the internal circuit by utilizing the change in the potential difference between the node and the one voltage supply section, it is possible to output a digital signal having a sufficient logic amplitude to the internal circuit of the reception side circuit even if the voltage amplitude of the signal transfer path is lowered to about several hundred mV, for example. Therefore, the electromagnetic interference (EMI) can be significantly reduced as compared to a case where a digital signal having a large voltage amplitude that transitions between the high level and the low level is transferred along the signal transfer path as in the prior art.

Moreover, with the clock frequency being equal, the signal transfer speed can be doubled for a signal transfer circuit that requires two signal lines per signal.

It is preferred that the precharge means operates according to a mode switching signal that is synchronized with a clock signal.

The signal transfer circuit may further include latch means for supplying the digital signal output from the node of the reception side circuit to the internal circuit of the reception side circuit in synchronism with the clock signal. In this way, it is possible to reliably send the digital signal into the internal circuit of the reception side circuit.

The signal transfer circuit may further include switching means for receiving a first voltage signal and a second voltage signal having different potentials from each other and alternately supplying the first voltage signal and the second voltage signal to the reception transistor according to the mode switching signal. In this way, it is possible to smoothly control the signal transfer operation.

The signal transfer circuit may employ a configuration in which: the precharge means is a MIS transistor whose source is connected to a power supply voltage supply section, whose gate receives the mode switching signal and whose drain is connected to the node; the reception transistor is a MIS transistor whose source is connected to the signal transfer path and whose drain is connected to the node; and the switching means is a selector circuit for alternately supplying the first voltage signal and the second voltage signal to the gate of the reception transistor according to the mode switching signal. In this way, the signal transfer circuit has a circuit configuration suitable for a case where MIS type semiconductor devices are used.

The signal transfer circuit may further include a level adjustment transistor, provided between the precharge transistor and the node, for adjusting the voltage level of the node. In this way, it is possible to prevent a large voltage, due to a gate-drain coupling capacitance, from being applied to the node, in a case where the precharge transistor is a MIS transistor.

The signal transfer circuit may further include: a second node, located in a second reception side circuit and connected to the internal circuit of the second reception side circuit, for outputting a digital signal to the internal circuit of the second reception side circuit; a second reception transistor located in the second reception side circuit between the second node and the signal transfer path; and second precharge means for precharging the second node so as to cause a potential difference between the voltage supply section of the transmission side circuit and the second node. In this way, it is possible to reduce the electromagnetic interference even in a case where a plurality of reception side circuits are provided.

The signal transfer circuit may further include: first latch means for supplying the digital signal output from the node of the reception side circuit to the internal circuit of the reception side circuit in synchronism with a rising signal synchronized with the clock signal; and second latch means for supplying the digital signal output from the second node of the second reception side circuit to the internal circuit of the second reception side circuit in synchronism with a falling signal synchronized with the clock signal. In this way, the digital signal can be transferred from one transmission side circuit to at least two reception side circuits while reducing the electromagnetic interference.

In such a case, the first voltage signal may be at the same potential as the second voltage signal during a wait period, so that the reception transistor is turned OFF, thereby suppressing a through current in the wait period and thus providing an effect of reducing the power consumption. Moreover, it is also effective in reducing the capacitance load and/or the current load of the output transistor of the transmission side circuit.

The signal transfer circuit may include a plurality of the reception side circuits, wherein: one of the reception side circuits applies a first voltage signal of the one of the reception side circuits by receiving a control signal a predetermined period of time before a data receiving operation starts; the one of the reception side circuits sets the first voltage signal at the same potential as the second voltage signal a predetermined period of time after the data receiving operation is completed; and the one of the reception side circuits outputs, to another one of the reception side circuits, a control signal for applying a first voltage signal to the other one of the reception side circuits a predetermined period of time before the data receiving operation is completed. In this way, it is possible to further reduce the power consumption.

The transmission side circuit may be a liquid crystal driver control circuit of a liquid crystal display panel; and the reception side circuit may be a liquid crystal driver IC of the liquid crystal display panel. Thus, in a control system for a liquid crystal display panel in which the transfer line is long and the electromagnetic interference is likely to occur, the present invention can provide particularly significant effects.

DESCRIPTION OF THE PREFERRED EMBODIMENTS

First Embodiment

Figure 1:
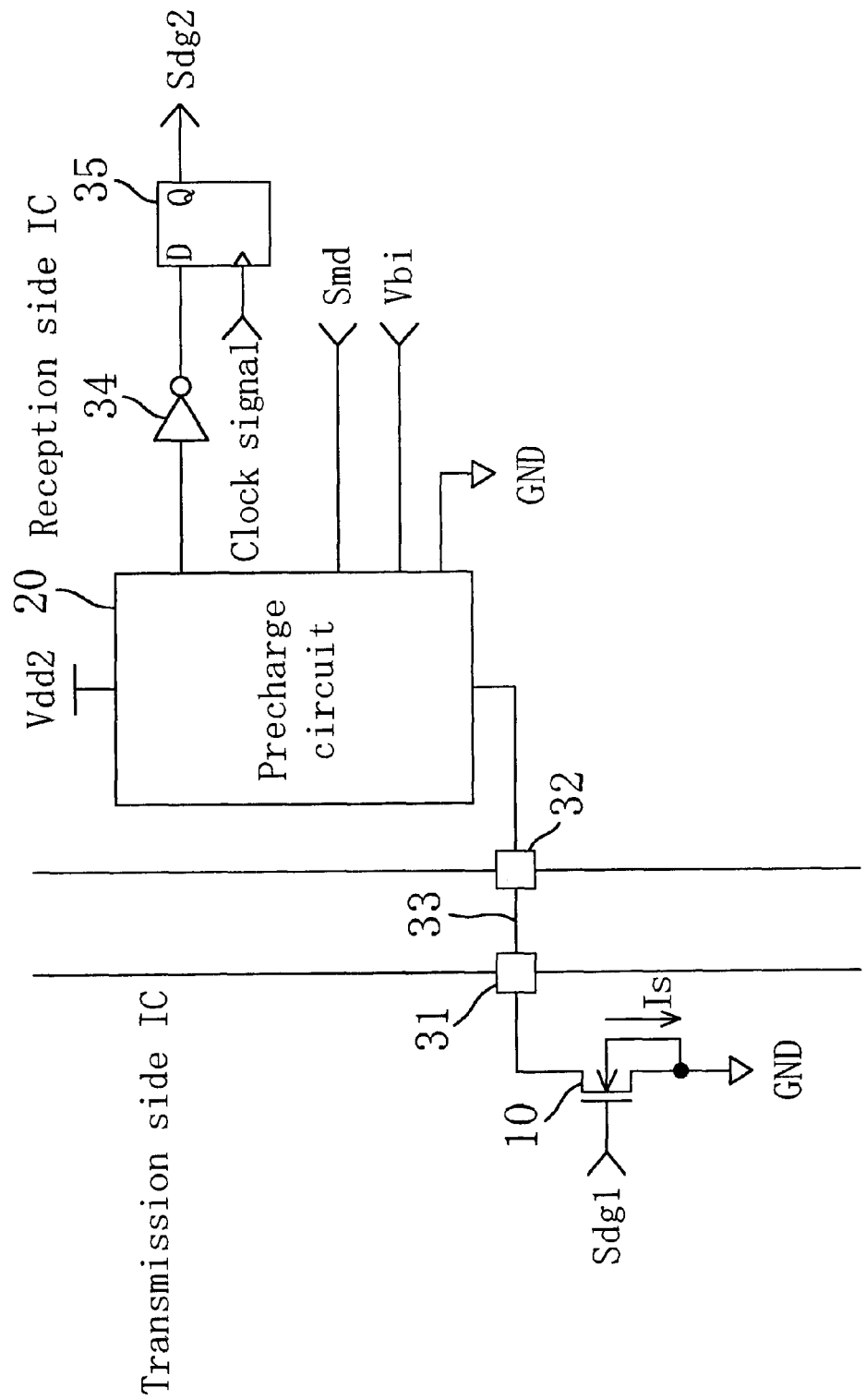
FIG. 1 is a diagram schematically illustrating a configuration of a signal transfer circuit bridging between a transmission side IC and a reception side IC according to a first embodiment of the present invention.

FIG. 1 is a diagram schematically illustrating a configuration of a signal transfer circuit bridging between a transmission side IC and a reception side IC according to a first embodiment of the present invention. As illustrated in the figure, the transmission side IC and the reception side IC are connected to each other by a signal transfer path 33, with respective external terminals 31 and 32 of the ICs being provided along the signal transfer path 33.

The transmission side IC includes an output n-channel transistor 10 for receiving a digital signal Sdg1 from an internal circuit of the transmission side IC, and the external terminal 31 for sending a digital signal to the reception side IC. The output n-channel transistor 10 employs a so-called "open drain" structure, with no load element being connected to the drain thereof. This is one feature of the present embodiment. The drain of the output n-channel transistor 10 is connected to the external terminal 31. The output n-channel transistor 10 is capable of functioning as an output circuit by itself.

The reception side IC includes the external terminal 32 for receiving a digital signal from the transmission side IC, a precharge circuit 20 for supplying an operating voltage to the output n-channel transistor 10 of the transmission side IC, an inverter circuit 34 provided along a line connecting the precharge circuit 20 to an internal circuit of the reception side IC, and a flip flop 35.

Figure 2:
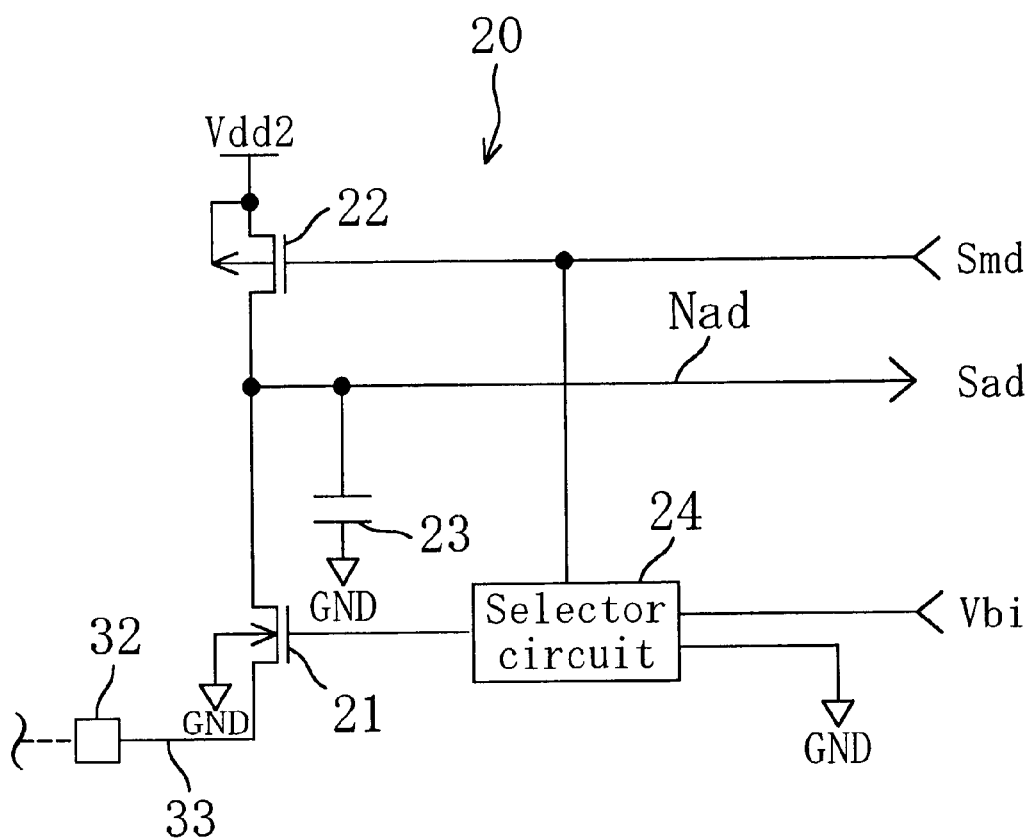
FIG. 2 is an electric circuit diagram illustrating a configuration of a precharge circuit according to the first embodiment of the present invention.

FIG. 2 is an electric circuit diagram illustrating a configuration of the precharge circuit 20 of the present embodiment. As illustrated in the figure, the precharge circuit 20 includes: a reception n-channel transistor 21 whose source is connected to the external terminal 32; a precharge p-channel transistor 22 whose source is connected to a terminal for supplying a power supply voltage vdd2, whose drain is connected to the drain of the reception n-channel transistor 21, and whose gate receives a mode switching signal; a capacitor 23 provided between the drains of the reception n-channel transistor 21 and the precharge p-channel transistor 22 and the ground; and a selector circuit 24 connected to the gate of the reception n-channel transistor 21. The selector circuit 24 receives a bias voltage Vbi, which is a first voltage signal, and a ground voltage Vss, which is a second voltage signal, and selectively applies the bias voltage Vbi or the ground voltage Vss to the gate of the reception n-channel transistor 21 according to a mode switching signal Smd.

In the precharge circuit 20 illustrated in FIG. 2, when the mode switching signal Smd is at the low level, the precharge p-channel transistor 22 is turned ON while the reception n-channel transistor 21 is turned OFF as it receives the ground voltage Vss at its gate. As a result, the potential of a node Nad connected to the drains of the transistors 21 and 22 is precharged to the high level.

When the mode switching signal Smd is at the high level, the precharge p-channel transistor 22 is turned OFF while the reception n-channel transistor 21 is turned ON as it receives the bias voltage Vbi at its gate. As a result, the potential of the node Nad connected to the drains of the transistors 21 and 22 transitions to the low level in a condition where a charge is extracted from the external terminals 31 and 32 (i.e., when the output n-channel transistor 10 of the transmission side IC is ON), and it is maintained at the high level in a condition where a charge is not extracted from external terminals 31 and 32 (i.e., when the output n-channel transistor 10 of the transmission side IC is OFF).

As described above, when the mode switching signal Smd is at the high level, whether the potential of the node Nad is high or low is determined based on whether the circuit is in such a state that a current can flow from the external terminals 31 and 32 to the transmission side circuit. Specifically, in the reception side IC illustrated in FIG. 1, when the output n-channel transistor 10 of the transmission side IC is ON, a low-level signal is output from the node Nad of the precharge circuit 20, and when the output n-channel transistor 10 of the transmission side IC is OFF, a high-level signal is output from the node Nad of the precharge circuit 20. The signal output to the node Nad is shaped by the inverter circuit 34 and then latched by the flip flop 35 in synchronism with an internal clock signal, after which it is send to the internal circuit as a digital signal Sdg2. As a result, the digital signal Sdg2 synchronized with the clock of the transmission side IC is sent to the internal circuit from the flip flop 35 of the reception side IC.

Figure 6:
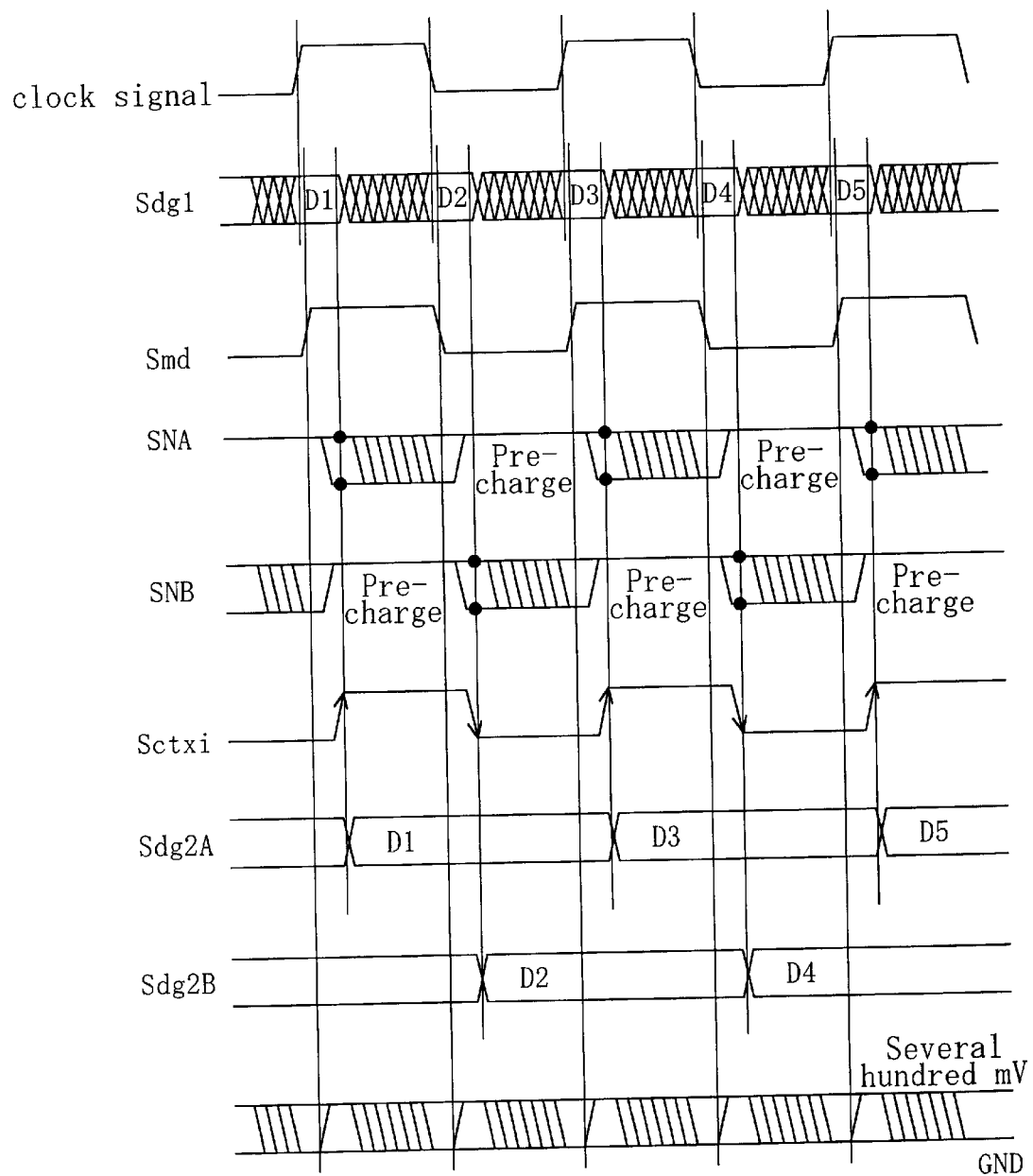
FIG. 6 is a timing chart illustrating changes over time of various signals of the signal transfer circuit according to the second embodiment of the present invention.

In the conventional transfer circuit, the transfer path of the signal transfer circuit carries a digital signal that has a large logic amplitude as it transitions from the high level to the low level. In contrast, according to the present embodiment, the output n-channel transistor 10 of the transmission side IC is either allowing a current to flow from the signal transfer path 33 to the ground (voltage supply section) or in an open state. When the current flows, the potential of the signal transfer path 33 is substantially equal to the ground voltage. When in the open state, the potential of the signal transfer path 33 is determined by the voltage supplied from the reception n-channel transistor 21 of the reception side IC. Thus, the voltage amplitude of the signal transfer path 33 can be set to about several hundred mV as illustrated in FIG. 6 to be described later. By utilizing the potential difference between the voltage at the node Nad and the ground, which is the voltage supply section of the output n-channel transistor 10, it is possible to produce the digital signal Sdg2, to be supplied to the internal circuit of the reception side IC, with a sufficient logic amplitude. Therefore, with the signal transfer circuit of the present embodiment, the electromagnetic interference (EMI) can be significantly improved as compared to the conventional signal transfer circuit using voltage signals.

Moreover, with the clock frequency being equal, the transfer speed can be doubled for a signal transfer circuit that requires two signal lines per signal.

First Variation

Variations of the precharge circuit 20 of the present embodiment will now be described.

Figure 3:
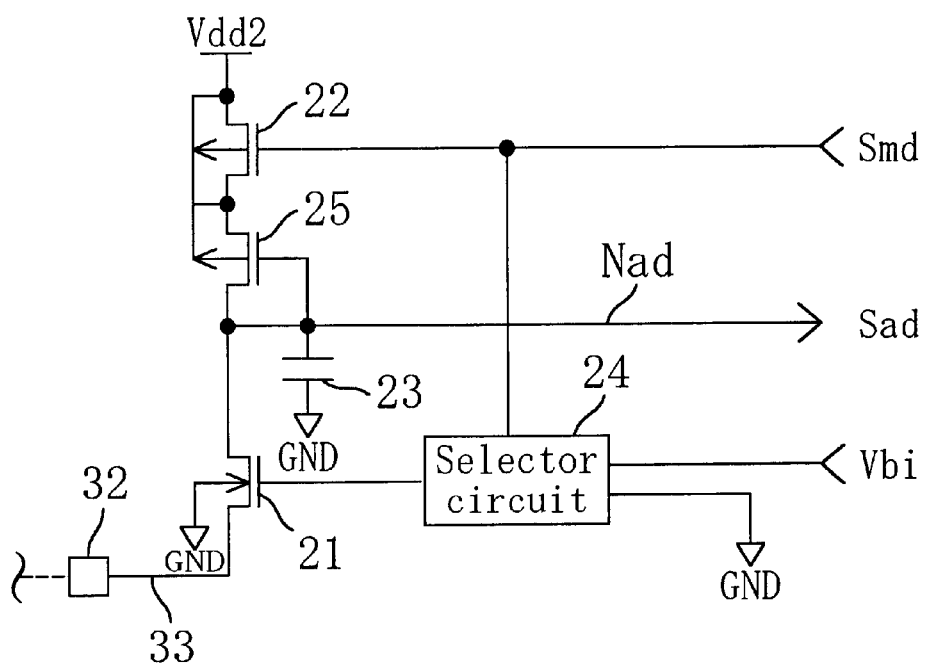
FIG. 3 is an electric circuit diagram illustrating a configuration of a precharge circuit according to a first variation of the first embodiment.

FIG. 3 is an electric circuit diagram illustrating a configuration of a precharge circuit according to a first variation of the first embodiment. As illustrated in the figure, the precharge circuit of the first variation includes a level adjustment p-channel transistor 25 arranged in series with the precharge p-channel transistor 22, in addition to the components of the precharge circuit illustrated in FIG. 2. The drain of the level adjustment p-channel transistor 25 is connected to the node Nad, the source thereof is connected to the drain of the precharge p-channel transistor 22, and the gate thereof is connected to the node Nad. In the precharge circuit illustrated in FIG. 2, a voltage equal to or greater than the power supply voltage Vdd2 may occur at the node Nad as the mode switching signal Smd transitions from the low level to the high level due to a floating capacitance between the gate and the drain of the precharge p-channel transistor 22. With the precharge circuit illustrated in FIG. 3, however, the high level can be lowered by the threshold voltage of the level adjustment p-channel transistor 25.

Second Variation

Figure 4:
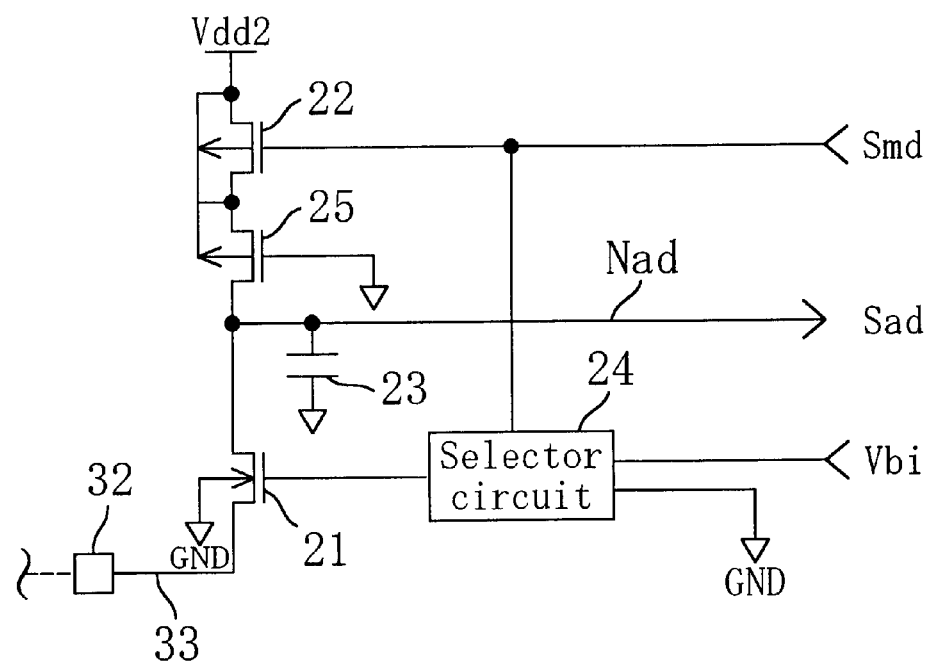
FIG. 4 is an electric circuit diagram illustrating a configuration of a precharge circuit according to a second variation of the first embodiment.

FIG. 4 is an electric circuit diagram illustrating a configuration of a precharge circuit according to a second variation of the first embodiment. As illustrated in the figure, the precharge circuit of the second variation also includes the level adjustment p-channel transistor 25, as in the first variation. In the second variation, however, the gate of the level adjustment p-channel transistor 25 is connected to the ground, with the potential of the gate being fixed at the ground level. Since the voltage applied to the gate of the level adjustment p-channel transistor 25 is fixed at the ground level, it is possible to reduce the crosstalk between the mode switching signal Smd and the signal flowing through the node Nad. As a result, the voltage fluctuation at the node Nad can be suppressed to a low level even when the mode switching signal Smd transitions from the low level to the high level.

Second Embodiment

Figure 5:
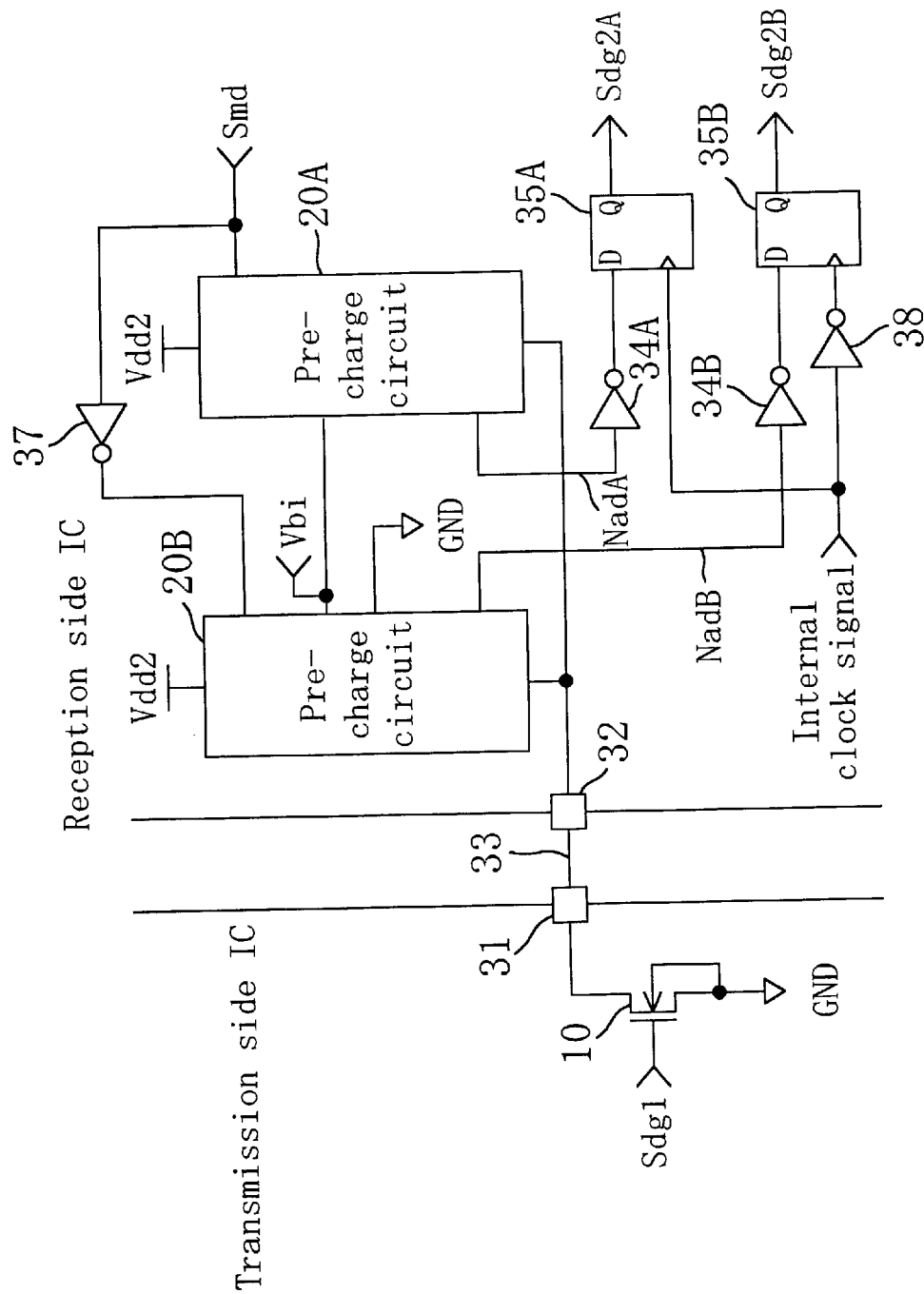
FIG. 5 is a diagram schematically illustrating a configuration of a signal transfer circuit bridging between a transmission side IC and a reception side IC according to a second embodiment of the present invention.

FIG. 5 is a diagram schematically illustrating a configuration of a signal transfer circuit bridging between a transmission side IC and a reception side IC according to a second embodiment of the present invention. As illustrated in the figure, according to the present embodiment, there are provided a pair of precharge circuits 20A and 20B, a pair of inverter circuits 34A and 34B and a pair of flip flops 35A and 35B. The precharge circuits 20A and 20B, the inverter circuits 34A and 34B and the flip flops 35A and 35B are structurally similar to the precharge circuit 20, the inverter circuit 34 and the flip flop 35, respectively, of the first embodiment. The mode switching signal Smd is supplied to the precharge circuit 20A, and an inverted version of the mode switching signal Smd is supplied to the precharge circuit 20B via an inverter circuit 37. Moreover, the output of the precharge circuit 20A is output to the internal circuit from the flip flop 35A via the inverter circuit 34A. On the other hand, the output of the precharge circuit 20B is output to the internal circuit from the flip flop 35B via the inverter circuit 34B. An internal clock signal is supplied to the flip flop 35A, and an inverted version of the internal clock signal is supplied to the flip flop 35B via an inverter circuit 38.

Other than this, the configuration of the present embodiment is as that of the first embodiment, with the precharge circuits 20A and 20B being connected in parallel to each other and to the external terminal 32 of the reception side IC and configured so as to alternately supply a current to the output n-channel transistor 10 of the transmission side IC. For example, the precharge circuit 20A operates as the precharge circuit 20 of the first embodiment, and the precharge circuit 20B operates as the precharge circuit 20A but in response to the reverse phase version of the mode switching signal Smd. Specifically, when the mode switching signal Smd is at the high level, the signal at the node NadA connected to the precharge circuit 20A is the effective data, whereas when the mode switching signal Smd is at the low level, the signal at the node NadB connected to the precharge circuit 20B is the effective data. A digital output signal Sdg2A is a signal that is obtained by waveform-shaping the signal output to the node NadA with the inverter circuit 34A and then latching it by the flip flop 35A at the leading edge of the internal clock signal. A digital output signal Sdg2B is a signal that is obtained by waveform-shaping the signal output to the node NadB with the inverter circuit 34B and then latching it by the flip flop 35B at the trailing edge of the internal clock signal.

Figure 7:
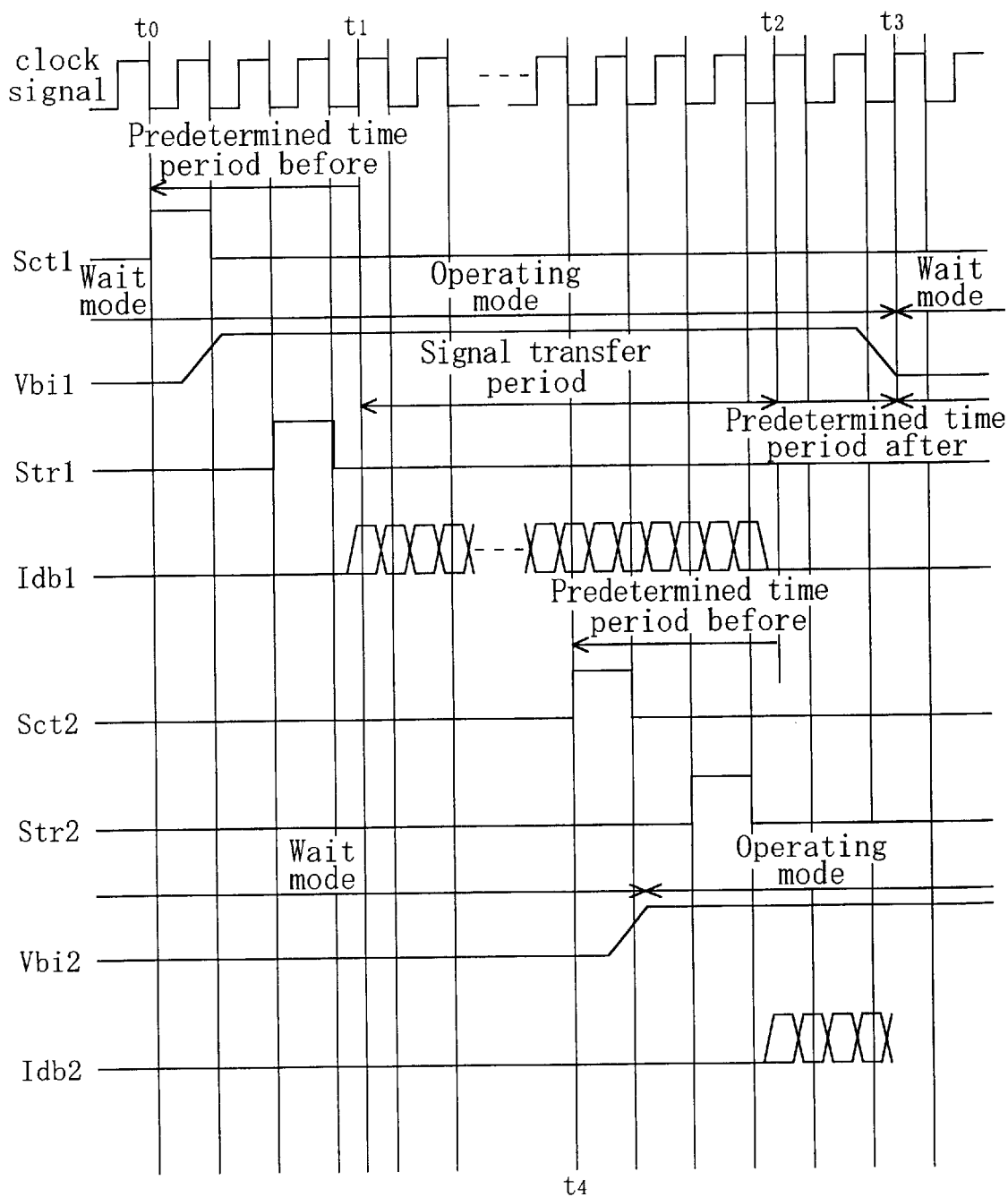
FIG. 7 is a timing chart illustrating changes over time of various signals of a signal transfer circuit according to a third embodiment of the present invention.
Figure 8:
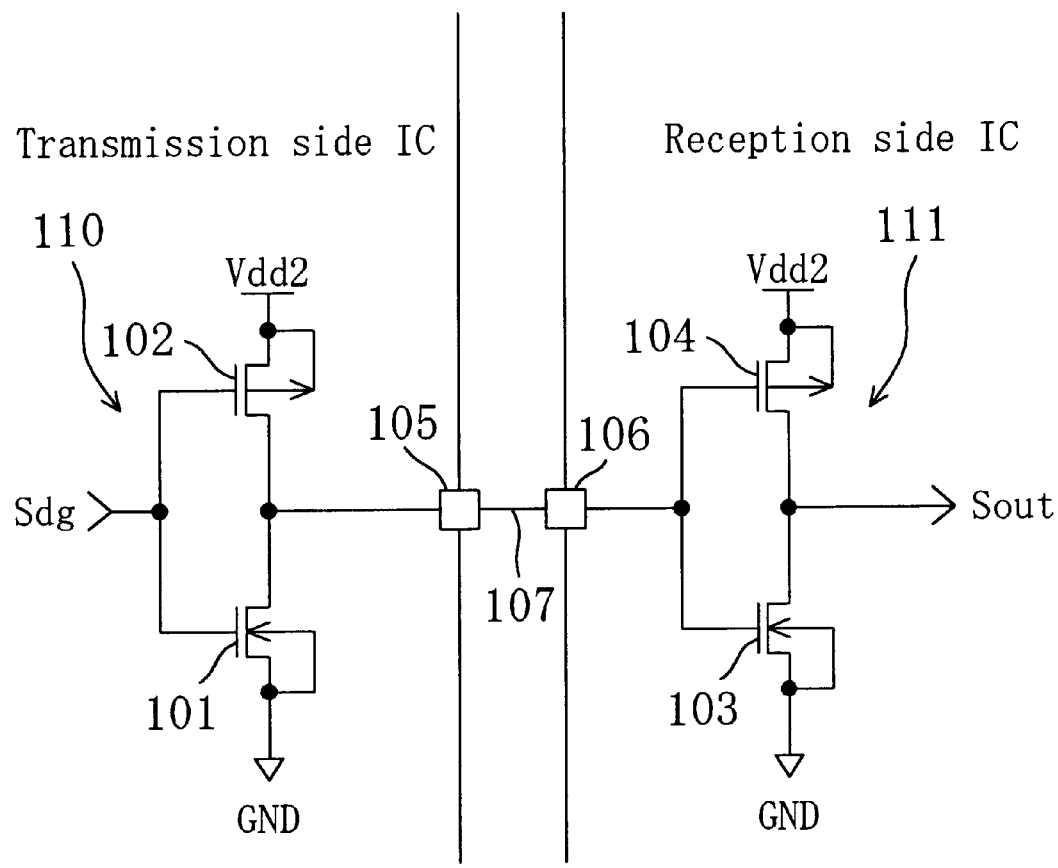
FIG. 8 is an electric circuit diagram illustrating a configuration of a conventional signal transfer circuit using CMIS devices.

FIG. 6 is a timing chart illustrating changes over time of various signals of the signal transfer circuit according to the present embodiment. FIG. 7 shows the timing waveforms of the following signals in the following order: a clock signal output by the transmission side IC; the digital signal Sdg1; the mode switching signal Smd; a drain signal SNA of the precharge circuit 20A; a drain signal SNB of the precharge circuit 20B; an internal clock signal Sclki; the digital output signal Sdg2A; the digital output signal Sdg2B; and the voltage Vin of the signal transfer path. Thus, data D1, D2, . . . , that is input as the digital signal Sdg1 to the output transistor 10 of the transmission side IC is alternately transferred to internal circuits of the reception side IC. Specifically, the data D1, D3, . . . , is transferred to the internal circuit of one of the reception side circuits as the digital signal Sdg2A, and the data D2, D4, . . . , is transferred to the internal circuit of the other reception side circuits as the digital signal Sdg2B.

As illustrated in FIG. 6, the amplitude of the voltage Vin of the signal transfer path 33 is at most several hundred mV, indicating that the voltage amplitude of the signal transfer path 33 is suppressed from that in the conventional signal transfer circuit, which is 2.3 V to 3.6 V.

With such a control, it is possible to smoothly send data to internal circuits of plural reception side circuits.

Third Embodiment

FIG. 7 is a timing chart illustrating changes over time of various signals of a signal transfer circuit according to a third embodiment of the present invention. The present embodiment incorporates a control for varying the bias voltage Vbi, instead of fixing the bias voltage Vbi as in the first and second embodiments, in order to reduce the power consumption. Specifically, where there are a plurality of reception side ICs, a reception side IC 1 receives a control signal Sct1 (at timing t0) a predetermined period of time before starting a signal transfer operation (at timing t1) in response to a transfer control signal Str1, and in response to the control signal Sct1, a bias voltage Vbi1 of the reception side IC 1 is switched to a predetermined voltage, thereby setting a signal transfer circuit of the reception side IC 1 in an operating mode. After passage of a predetermined period of time (timing t3) from the completion of the signal transfer operation (timing t2), the bias voltage Vbi1 is switched to the ground potential, thereby setting the signal transfer circuit of the reception side IC 1 in a wait mode. Moreover, a control signal Sct2 and a transfer control signal Str2 for another reception side IC 2 are generated as follows. The control signal Sct2 is output (at timing t4) a predetermined period of time before the signal transfer operation to the reception side IC 1 is completed (at timing t2), and then the transfer control signal Str2 is output. Thus, it is possible to successively transfer data signals to a plurality of ICs.

In this way, it is possible to smoothly transfer digital signals even when there are many reception side circuits.

Alternative Embodiments

Each of the embodiments described above provides particularly significant effects in a case where the transmission side circuit is a driver control circuit of a liquid crystal display panel, and the reception side circuit is a liquid crystal driver circuit of the liquid crystal display panel. For example, each of the embodiments described above can be used in input/output devices, incorporated in a liquid crystal driver circuit for driving a TFT matrix color liquid crystal display panel and a driver control circuit (control LSI) for driving the liquid crystal driver circuit, for transferring digital color image signals therebetween. When the liquid crystal driver circuit is provided in an integrated circuit, many of such liquid crystal driver circuits are provided next to one another corresponding to the columns of a single TFT matrix color liquid crystal display panel. Typically, liquid crystal driver circuits of a liquid crystal display panel are provided as X driver ICs and Y driver ICs along two sides of the liquid crystal display panel, with a driver control circuit being provided at a corner of the liquid crystal display panel, whereby the electromagnetic interference along the lines through which digital signals are transferred from the driver control circuit to the liquid crystal driver circuits presents significant problems.

In the embodiments described above, the output transistor, the reception transistor, the precharge transistor and the level adjustment transistor are all MIS transistors (MISFETs). Alternatively, some or all of these transistors may be bipolar transistors. In such a case, the output transistor, for example, can be an open collector type bipolar transistor.

Moreover, where the output transistor, the reception transistor, the precharge transistor and the level adjustment transistor are all MIS transistors as in the embodiments described above, the conductivity type of each of the MIS transistors is not limited to that in the embodiments described above. Alternatively, the p-channel type transistors and the n-channel type transistors may be switched to each other. Moreover, the power supply voltage Vdd and the ground voltage Vss may be switched to each other.

What is claimed is:

1. A signal transfer circuit for connecting one transmission side circuit and one or more reception side circuit via a signal transfer path including one signal transfer line per signal, the signal transfer circuit comprising:

an output transistor, provided between one voltage supply section in the transmission side circuit and the signal transfer path, for operating according to a digital signal from an internal circuit of the transmission side circuit;

a node, located in the reception side circuit and connected to an internal circuit of the reception side circuit, for outputting a digital signal to the internal circuit of the reception side circuit;

a reception transistor located in the reception side circuit between the node and the signal transfer path; and precharge means for precharging the node so as to cause a potential difference between the voltage supply section of the transmission side circuit and the node;

wherein the precharge means operates according to a mode switching signal that is synchronized with a clock signal;

said signal transfer circuit further comprising latch means for supplying the digital signal output from the node of the reception side circuit to the internal circuit of the reception side circuit in synchronism with the clock signal.

2. The signal transfer circuit of claim 1, further comprising switching means for receiving a first voltage signal and a second voltage signal having different potentials from each other and alternately supplying the first voltage signal and the second voltage signal to the reception transistor according to the mode switching signal.

3. The signal transfer circuit of claim 2, wherein:

the precharge means is a MIS transistor whose source is connected to a power supply voltage supply section, whose gate receives the mode switching signal and whose drain is connected to the node;

the reception transistor is a MIS transistor whose source is connected to the signal transfer path and whose drain is connected to the node; and the switching means is a selector circuit for alternately supplying the first voltage signal and the second voltage signal to the gate of the reception transistor according to the mode switching signal.

4. The signal transfer circuit of claim 3, further comprising a level adjustment transistor, provided between the precharge transistor and the node, for adjusting a voltage level at the node.

5. The signal transfer circuit of claim 2, further comprising:

a second node, located in a second reception side circuit and connected to the internal circuit of the second reception side circuit, for outputting a digital signal to the internal circuit of the second reception side circuit;

a second reception transistor located in the second reception side circuit between the second node and the signal transfer path; and second precharge means for precharging the second node so as to cause a potential difference between the voltage supply section of the transmission side circuit and the second node.

6. The signal transfer circuit of claim 5, further comprising:

first latch means for supplying the digital signal output from the node of the reception side circuit to the internal circuit of the reception side circuit in synchronism with a rising signal synchronized with the clock signal; and second latch means for supplying the digital signal output from the second node of the second reception side circuit to the internal circuit of the second reception side circuit in synchronism with a falling signal synchronized with the clock signal.

7. The signal transfer circuit of claim 2, wherein the first voltage signal is at the same potential as the second voltage signal during a wait period.

8. The signal transfer circuit of claim 7, comprising a plurality of the reception side circuits, wherein:

one of the reception side circuits applies a first voltage signal of the one of the reception side circuits by receiving a control signal a predetermined period of time before a data receiving operation starts;

the one of the reception side circuits sets the first voltage signal at the same potential as the second voltage signal a predetermined period of time after the data receiving operation is completed; and the one of the reception side circuits outputs, to another one of the reception side circuits, a control signal for applying a first voltage signal to the other one of the reception side circuits a predetermined period of time before the data receiving operation is completed.

9. The signal transfer circuit of claim 1, wherein:

the transmission side circuit is a liquid crystal driver control circuit of a liquid crystal display panel; and the reception side circuit is a liquid crystal driver circuit of the liquid crystal display panel.

* * * * *